United States Patent [19]
Tsuda

[11] Patent Number: 5,412,315
[45] Date of Patent: May 2, 1995

[54] SEMICONDUCTOR INTEGRATED CIRCUIT ADAPTED FOR A CURRENT-LEAK TEST

[75] Inventor: Noriko Tsuda, Tokyo, Japan

[73] Assignee: NEC Corporation, Tokyo, Japan

[21] Appl. No.: 157,223

[22] Filed: Nov. 23, 1993

[30] Foreign Application Priority Data

Nov. 26, 1992 [JP] Japan .................................. 4-317017

[51] Int. Cl.6 .......................................... G01R 31/28
[52] U.S. Cl. ................. 324/158.1; 324/73.1; 371/22.6
[58] Field of Search ............... 371/22.1, 22.5, 22.6; 324/73.1, 158.1; 307/446; 364/763

[56] References Cited

U.S. PATENT DOCUMENTS 4,697,140  9/1987  Saito .................................. 324/73.1
5,294,883  3/1994  Akiki ................................. 324/73.1

*Primary Examiner*—Kenneth A. Wieder
*Assistant Examiner*—Mark Wardas
*Attorney, Agent, or Firm*—Whitham, Curtis Whitham & McGinn

[57] ABSTRACT

A semiconductor circuit adapted for a current leak testing has a first circuit operated by a large current and a second circuit operated by a small current. The small current refers to a current required by an ordinary semiconductor integrated circuit (IC) having only digital logic, and the large current refers to at least an order of tens the small current. The circuit generates an operation mode signal of a first logic level when performing a current-leak test of the IC and outputs an operation mode signal of a second logic level otherwise. Operation of the first circuit is inhibited and the output fixed at a prescribed logic level when the operation mode signal is of the first logic level. A third circuit equivalent to the first circuit when the first circuit is in normal operation receives a data signal identical to the first circuit and is operated by a small current. A selection circuit transmits the output of the first circuit to an internal circuit of the IC when the operation mode signal is of the second logic level and transmits the output of the third circuit to the internal circuit when the operation mode signal is of the first logic level.

10 Claims, 2 Drawing Sheets

SEMICONDUCTOR INTEGRATED CIRCUIT ADAPTED FOR A CURRENT-LEAK TEST

BACKGROUND OF THE INVENTION

1. Field of the Invention

The present invention relates to a semiconductor integrated circuit having both analog circuits and digital circuits mounted on the same substrate, and in particular relates to a semiconductor integrated circuit adapted for a current leak test.

2. Description of the Related Art

An analog circuit such as a comparator is generally constructed including a constant-current source, and consequently, a semiconductor integrated circuit including both digital circuits and this type of analog circuits requires an extremely large current of up to several tens or several hundred times the current required by an ordinary semiconductor integrated circuit having only digital logic. This type of semiconductor integrated circuit having both analog circuits and digital circuits mounted on the same substrate will hereinafter be referred to as an analog-digital IC.

In an analog-digital IC, the inherently large drive current complicates the detection of a current leak caused by an abnormality in internal logic. Accordingly, in analog-digital ICs of the prior art, a method has been employed in which a disable circuit is provided that disables the analog circuit and cuts off circuit current and, when performing a test, a test mode signal St is activated to operate the disable circuit and cut off the current of the analog circuit.

FIG. 1(a) shows an example of an analog-digital IC provided with a conventional comparator having a disable circuit, and FIG. 1(b) is a circuit diagram of a comparator having a disable circuit. A comparator having a disable circuit will hereinafter be referred to as a D-comparator, and the intrinsic comparator portion will be referred to as the comparator.

In FIG. 1(a), reference voltage VG1 is applied to the inverting input of the D-comparator 1 and input signal Si is supplied to non-inverting input by way of input terminal Ti. Test mode signal St and inverted test mode signal StR are inputted into the input terminals TE and TER, respectively, of the D-comparator 1. When test mode signal St is active (logic 1), the operation of the comparator, i.e., the comparator portion within the D-comparator, is disabled, and when test mode signal St is inactive (logic 0), the comparator performs normal operation. In the state in which the operation of the comparator is disabled, i.e., in the disable state, the circuit current of the comparator is cut off and the output signal S1 set to high level (H level).

As shown in FIG. 1(b), the D-comparator 1 is composed of a comparator 10 made up of a differential circuit 1a and a driving circuit 1b and a disable circuit. The differential amplifier circuit 1a is an ordinary differential amplifier circuit composed of a source coupled PMOS difference transistors Qp4 and Qp5, and a current source made up of a PMOST (a PMOS transistor) Qp1, and NMOS load transistor Qn2 and Qn3. The current output of current source transistor Qp1 is controlled by gate bias VG2. In the circuit shown in the figure, of the differential transistors Qp4 and Qp5, transistor Qp4 is an inverting input transistor to which reference voltage VG1 is applied. The load transistor Qn2 has a gate and drain interconnected to form a diode connection, and the signal produced at the output terminal T1 of transistor Qp4 is applied to the gate of load transistor Qn3 of non-inverted input transistor Qp5. By means of this connection, the single-ended output of the differential amplifier circuit 1a is generated at the output terminal T2 of transistor Qp5.

The drive circuit 1b is an NMOS inverter provided for driving the internal circuit 7 by supplying the output of the differential amplifier circuit 1a. The gate of load transistor Qp2 is connected to gate bias VG2.

The disable circuit is provided with NMOST Qn1 and Qn4 and PMOST Qp3. NMOST Qn1 and Qn4 are each connected in parallel to load transistors Qn2 and Qn3, and the gates of transistors Qn1 and Qn4 are connected to test mode signal St. PMOST Qp3 is connected in parallel to transistor Qp2 of the drive circuit 1b, and its gate is connected to inverted test mode signal StR. Further, when test mode signal St is active, gate bias VG2 is made a value for cutting off the drain current of transistors Qp1 and Qp2.

The circuit of FIG. 1(b) operates as follows: In normal operating mode, the test mode signal is set at low level. In this case, NMOST Qn1 and Qn4 are turned off and PMOST Qp3 is also turned off by inverted test mode signal StR of high level. As a result, the comparator performs normal operation.

In test mode, the test mode signal is set to high level. In this case, transistors Qn1 and Qn4 are turned on, thereby lowering the source-drain voltages of transistors Qn2 and Qn3. As a result, the gate voltage of transistor Qn5 becomes low-level, whereby transistor Qn5 is turned off. On the other hand, PMOS Qp3 is turned on by low-level inverted test mode signal StR, and as a result, the output S1 of the D-comparator becomes high level. At this time, the absolute value of the gate bias of transistors Qp1 and Qp2 is lowered below a threshold voltage by means of a circuit not illustrated in the figure, thereby cutting off the drain current of transistors Qp1 and Qp2.

In this way, the current of the differential amplifier circuit 1a and the drive circuit 1b is cut off, and moreover, the output S1 of the D-comparator 1 is fixed at a high level regardless of input signal Si.

During the test mode of the above-described analog-digital IC of the prior art, regardless of the signal supplied at the input terminal, the signal will not be transmitted to the internal circuit because the operation of the comparator is halted and its output voltage is fixed, and the internal circuit will therefore be fixed unchanged at a constant state. Consequently, there exists the problem that, in a case in which a current leak is generated in an internal state other than that fixed state, the current leak will not be detectable. In addition, there exists the problem that the failure points causing the leak cannot be analyzed.

SUMMARY OF THE INVENTION

The purpose of the present invention is to provide a semiconductor integrated circuit capable of performing a current-leak test while operating its internal circuit even when operation of an analog circuit is halted.

In order to achieve this purpose, the semiconductor integrated circuit adapted for current-leak tests of the present invention, in which is mounted both a first circuit operated by a large current and a second circuit operated by a small current, is equipped with:

operation mode signal generating means that outputs an operation mode signal of a first logic level when performing a current-leak test of the semiconductor integrated circuit, and that outputs an operation mode signal of a second logic level when driving the semiconductor integrated circuit in normal operation;

disable means that disables the operation of the first circuit and forcibly fixes the output of the first circuit at a fixed logic level when the operation mode signal is at the first logic level, and enables the operation of the first circuit when the operation mode signal is at the second logic level;

A third circuit that is equivalent to the first circuit when the first circuit is in normal operation, that receives a data signal identical to the first circuit, and that is operated at a low current; and selection means that transmits the output of the first circuit to the internal circuit of the semiconductor integrated circuit when the operation-mode signal is at the second logic level, and that transmits the output of the third circuit to the internal circuit when the operation mode signal is at the first logic level.

By disabling the first circuit and cutting off the large circuit current when the operation mode signal is at the first logic level, the detectability of a minute current leak in the internal circuit can be raised, and furthermore, by operating the internal circuit with the third circuit that operates on low current to perform functions in place of the disabled first circuit, faulty points can be easily analyzed.

The above and other objects, features, and advantages of the present invention will become apparent from the following description referring to the accompanying drawings which illustrate examples of preferred embodiments of the present invention.

DETAILED DESCRIPTION OF THE PREFERRED EMBODIMENTS

Figure 1A:
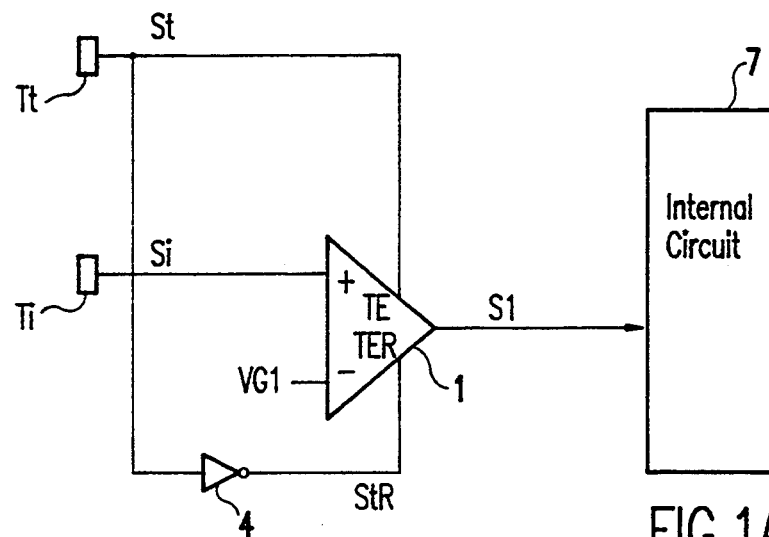
FIG. 1(a) shows one example of a analog-digital IC equipped with a comparator having a disable circuit of the prior art.
Figure 1B:
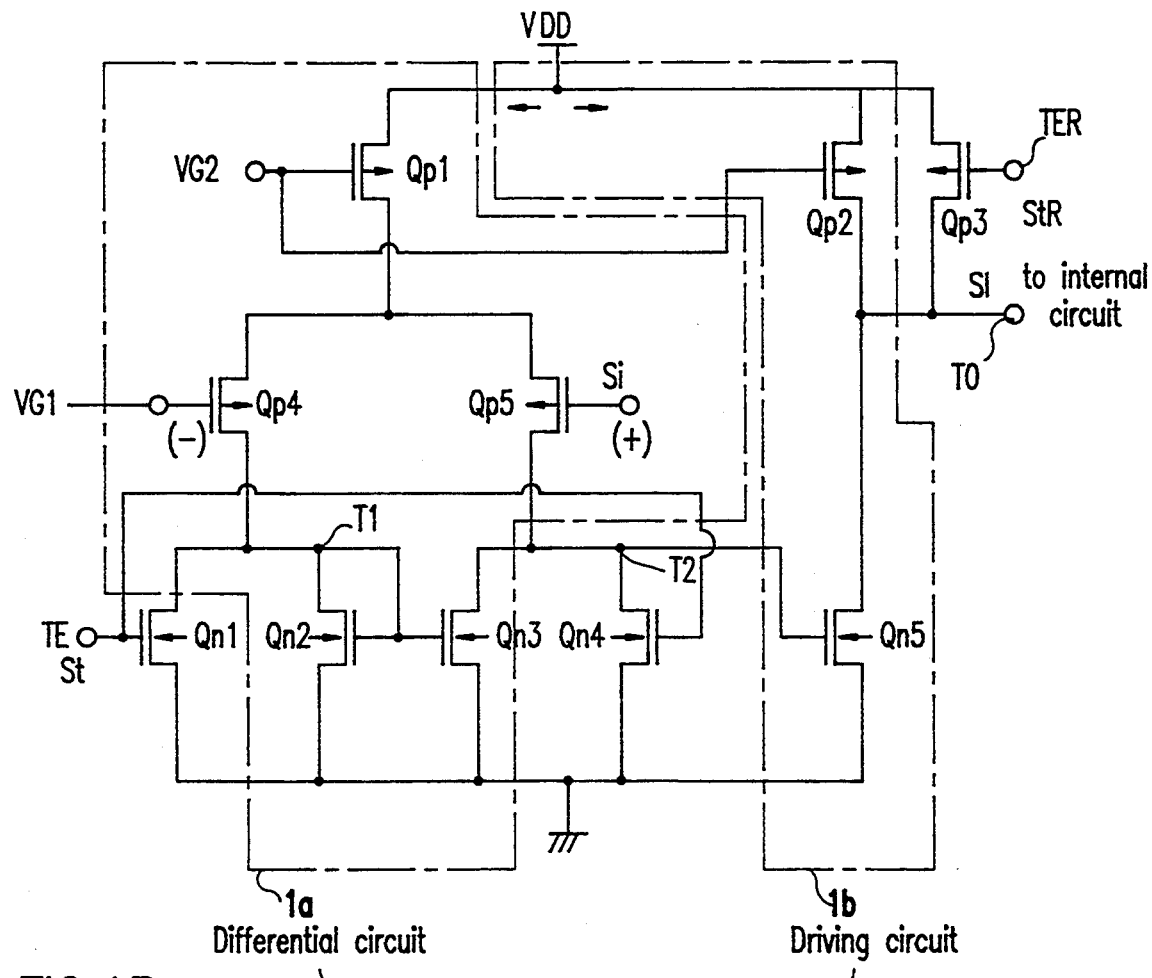
FIG. 1(b) is a circuit diagram showing a comparator having a disable circuit.
Figure 2:
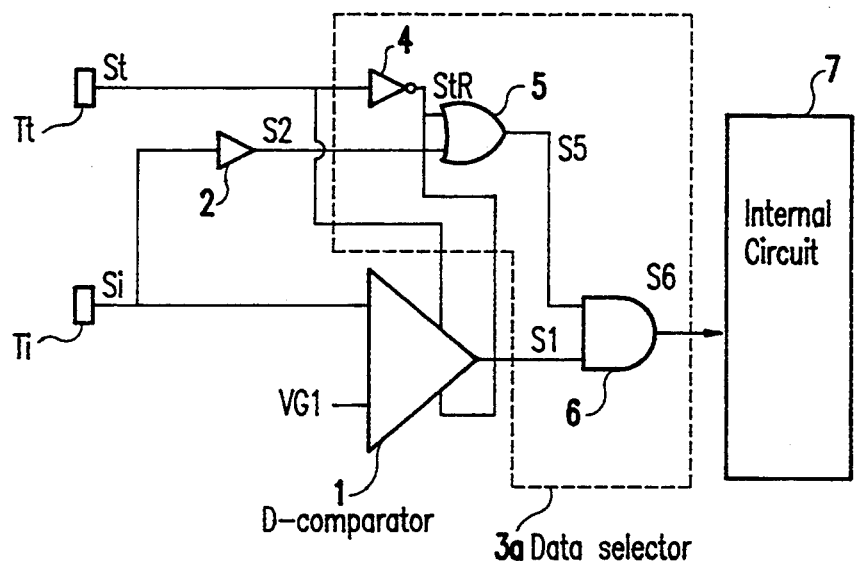
FIG. 2 is a block diagram of the first embodiment of the semiconductor integrated circuit adapted for current-leak tests according to the present invention.

FIG. 2 is a block diagram of the first embodiment of the semiconductor integrated circuit adapted for current-leak tests according to the present invention. This embodiment of the analog-digital IC incorporates a buffer 2 and data selector 3a into the circuit of the prior art shown in FIGS. 1(a) and 1(b). The buffer 2 is a logic gate that is the logic equivalent of the comparator 10 of FIG. 1(b), and when signal Si is supplied, the buffer 2 transmits a signal of the same logic as is generated by the D-comparator 1 during normal operation, i.e., as is generated by the comparator 10.

The data selector 3a selects either the output of the D-comparator 1 or the output of the buffer 2 according to the logic level of test mode signal St and transfers the selected output to the internal circuit 7 as output signal S6. The data selector 3a is made up of an inverter 4, an OR gate 5 and an AND gate 6. The inverter 4 inverts test mode signal St and outputs inverted test mode signal StR. The OR gate 5 is supplied with inverted test mode signal StR and output signal S2 of the buffer 2 and outputs the logical sum S5 of the two input signals. The AND gate 6 generates the logical product of output signal S1 of the D-comparator 1 and signal S5 and transmits the product as output signal S6.

In normal operation mode, test mode signal St is set to logic 0, and accordingly, the OR gate 5 outputs signal S5 of logic 1 regardless of output signal S2 of the buffer 2, and in this state, the AND gate 6 is caused to transmit output S1 of the D-comparator 1. As described above, in normal operation mode, the comparator 10 within the D-comparator 1 is in operation, and accordingly, the AND gate 6 outputs the output of the comparator 10 as output signal S6.

In test mode, the test mode signal is set to logic 1. Accordingly, the input signal StR of OR gate 5 becomes 0, which causes OR gate 5 to transmit output S2 of the buffer 2 as signal S5. On the other hand, as described above, when test mode signal St is logic 1, the D-comparator 1 provides output S1 of logic 1. As a result, the AND gate 6 transmits signal S5, i.e., output S2 of the buffer 2, as output signal S6.

In this way, the circuit of FIG. 2 provides the output of the comparator 10 to the internal circuit 7 during normal operation and provides the output of the buffer 2 to the internal circuit 7 during test mode.

Figure 3:
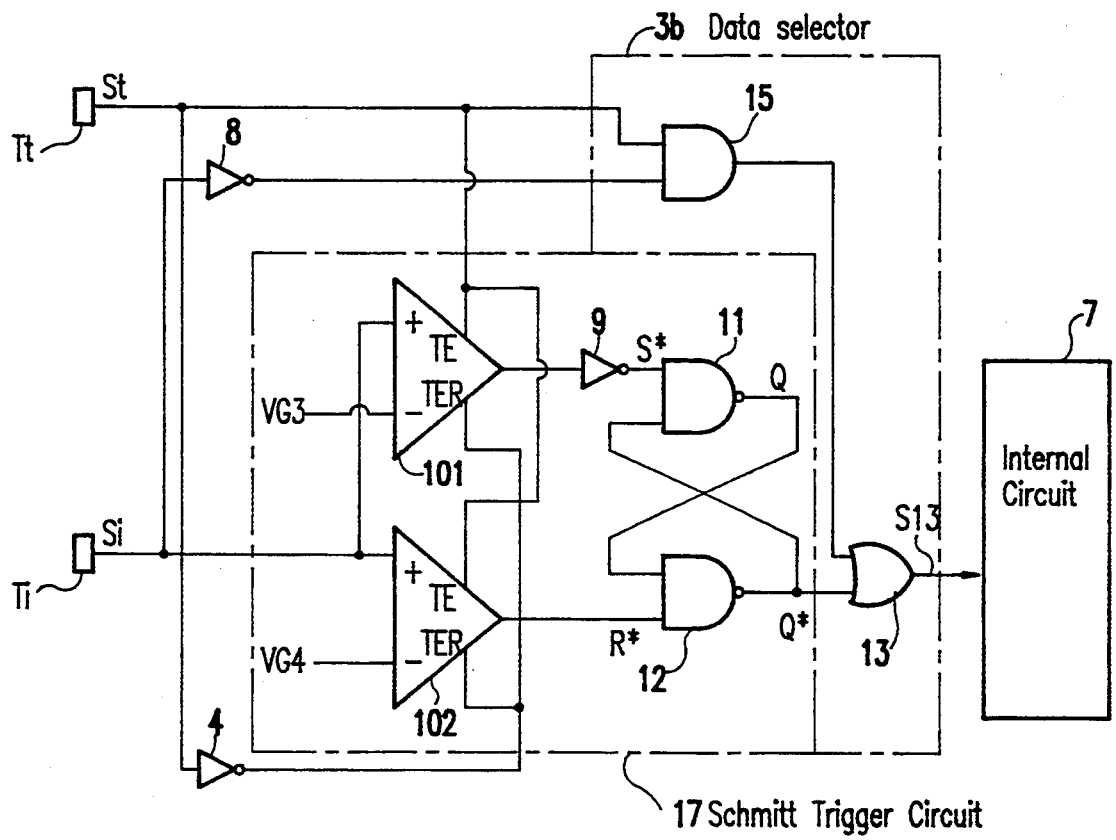
FIG. 3 is a block diagram of the second embodiment of the semiconductor integrated circuit adapted for current-leak tests according to the present invention.

FIG. 3 is a block diagram showing the second embodiment of the semiconductor integrated circuit adapted for current-leak tests according to the present invention.

The circuit of the present embodiment is provided with a Schmitt trigger circuit 17 as an analog circuit and in addition, is equipped with an inverter 8 as a logic gate logically equivalent to the Schmitt trigger circuit 17 and a data selector 3b that selects either the output of the Schmitt trigger circuit 17 or the output of the inverter 8 in accordance with the logic level of test mode signal St.

The Schmitt trigger circuit 17 is a known circuit composed of a set-reset flip-flop made up of two NAND gates 11 and 12, two D-comparators 101 and 102, and an inverter 9. Reference voltages VG3 and VG4 are applied to the inverting input terminals of each D-comparator 101 and 102, and input signal Si is supplied to the non-inverted terminals. The output of D-comparator 102 is connected to the R* input terminal of the SR flip-flop, and the output of D-comparator 101 is coupled to the S* input terminal of the SR flip-flop after being inverted by inverter 9. In the present embodiment, VG3 is set higher than VG4. As a result, (VG3−VG4) causes the hysteresis of the output of the trigger circuit. The output of the Schmitt trigger circuit 17 is delivered from the Q* terminal of the SR flip-flop. Inverter 8 provides a signal of the same logic as the Schmitt trigger circuit 7. The data selector 3b is made up of an OR gate 13 and an AND gate 15. The AND gate 15 provides the logical product of the output of inverter 8 and test mode signal St. The OR gate 13 provides the logical sum of the output of the AND gate 15 and the output of the Schmitt trigger circuit 17 to the internal circuit 7 as output S13.

In normal operation mode, test mode signal St is set to logic 0. Accordingly, The D-comparators 101 and 102 operate as normal comparators, and the Schmitt trigger circuit 17 also operates as normal. When a test mode signal of logic 0 is applied to the AND gate 15, the AND gate 15 outputs a signal of logic 0 to the OR gate 13 regardless of the output of inverter 8. The OR gate 13 consequently transmits the output of the Schmitt trigger circuit 17 as output signal S13.

In test mode, test mode signal St is set to logic 1. Accordingly, the D-comparators 101 and 102 output logic 1 regardless of input signal Si. As a result, the SR flip-flop receives logic 0 at its S* input terminal and logic 1 at its R* input terminal and outputs logic 0 from its Q* output terminal. On the other hand, the AND gate 15 transmits the output of inverter 8. As a result, the OR gate 13 transmits as output signal S13 the output of inverter 8 delivered from the AND gate 15.

In this way, by disabling the analog circuit and cutting off the large circuit current in test mode, the detectability of a minute current leak in the internal circuit can be improved, and furthermore, by operating the internal circuit with the low-current logic gate taking over the functions of the disabled analog circuit, faulty points can also be easily analyzed.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor integrated circuit adapted for a current-leak test, including both a first circuit operated by a large current and a second circuit operated by a small current, wherein said small current refers to a current required by an ordinary semiconductor integrated circuit having only digital logic, and said large current refers to at least an order of ten times the small current, the semiconductor integrated circuit comprising:

operation mode signal generating means that outputs an operation mode signal of a first logic level when performing a current-leak test of the semiconductor integrated circuit, and that outputs an operation mode signal of a second logic level when operating the semiconductor integrated circuit in normal operation;

disable means that inhibits the operation of the first circuit and forcibly fixes an output of the first circuit to a prescribed logic level when the operation mode signal is of the first logic level, and enables operation of the first circuit when the operation mode signal is of the second logic level;

a third circuit that is equivalent to the first circuit when the first circuit is in normal operation, that receives a data signal identical to that supplied to the first circuit, and that is operated by a small current; and selection means, having a first data input connected to the output of the first circuit and a second data input connected an output of the third circuit, that transmits the output of the first circuit to an internal circuit of the semiconductor integrated circuit when the operation mode signal is of the second logic level, and transmits the output of the third to the internal circuit when the operation mode signal is of the first logic level.

2. The circuit according to claim 1 wherein the selection means has first and second gate means; the first gate means receiving the operation mode signal and output of the third circuit and outputting output of the third circuit when the operation mode signal is of the first logic level, and when the operation mode signal is of the second logic level, outputting a signal of logic level identical to the signal of the prescribed logic level outputted by the first circuit when the operation mode signal is of the first logic level;

the second gate means receiving the output of the first circuit and the output of the first gate means and transmitting output of the first gate means when the operation-mode signal is of the first logic level, and when the operation-mode signal is of the second logic level, transmitting the output of the first circuit.

3. A semiconductor integrated circuit adapted for a current-leak test, including both a first circuit operated by a large current and a second circuit operated by a small current, Wherein said small current refers to a current required by an ordinary semiconductor integrated circuit having only digital logic, and said large current refers to at least an order of ten times the small current, the semiconductor integrated circuit comprising:

operation mode signal generating means that outputs an operation mode signal of a first logic level when performing a current-leak test of the semiconductor integrated circuit, and that outputs an operation mode signal of a second logic level when operating the semiconductor integrated circuit in normal operation;

disable means that inhibits the operation of the first circuit and forcibly fixes an output of the first circuit to a prescribed logic level when the operation mode signal is of the first logic level, and enables operation of the first circuit when the operation mode signal is of the second logic level;

a third circuit that is equivalent to the first circuit when the first circuit is in normal. Operation, that receives a data signal identical to that supplied to the first circuit, and that is operated by a small current, wherein the first circuit is an analog circuit, the second circuit is a digital circuit, and the third circuit is a logic gate that is logically equivalent to the analog circuit; and selection means, having a first data input connected to the output of the first circuit and a second data input connected an output of the third circuit, that transmits the output of the first circuit to an internal circuit of the semiconductor integrated circuit when the operation mode signal is of the second logic level, and transmits the output of the third to the internal circuit when the operation mode signal is of the first logic level, wherein the selection means has first and second gate means, the first gate means receiving the operation mode signal and output of the third circuit and outputting the output of the third circuit when the operation mode signal is of the first logic level, and when the operation mode signal is of the second logic level, outputting a signal of logic level identical to the signal of the prescribed logic level outputted by the first circuit when the operation mode Signal is of the first logic level, the second gate means receiving the output of the first circuit and the output of the first gate means and transmitting output of the first gate means when the operation-mode signal is of the first logic level, and when the operation-mode Signal is of the second logic level, transmitting the output of the first circuit.

4. The circuit according to claim 3 wherein the analog circuit is a comparator, the comparator being forced by the disable means to output a signal of high level when the operation mode signal is of high level, and when the operation mode signal is of low level, the comparator being allowed to perform normal operation; and the third circuit is a buffer that performs logic operation identical to normal operation of the comparator.

5. The circuit according to claim 4 wherein the first gate means of the selection means is provided with an inverter that inverts the operation mode signal and an OR gate that receives the output of the inverter and the output of the buffer, and the second gate means is an AND gate that inputs the output of the OR gate and the output of the comparator.

6. The circuit according to claim 3 wherein the analog circuit is a Schmitt trigger circuit, the Schmitt trigger circuit being forced by the disable means to output a signal of low level when the operation mode signal is of high level, and when the operation mode signal is of low level, the Schmitt trigger circuit being allowed to perform normal operation; and the third circuit is an inverter that performs logic operation identical to the normal operation of the Schmitt trigger circuit.

7. The circuit according to claim 6 wherein the first gate means of the selection means is provided with an AND gate that receives the operation mode signal and the output of the inverter, and the second gate means is provided with an OR gate that inputs both the output of the AND gate means and the output of the Schmitt trigger circuit.

8. A semiconductor integrated circuit adapted for a current-leak test, including both a first circuit of an analog circuit and a second circuit of a digital circuit, the semiconductor integrated circuit comprising:
   operation mode signal generating means that outputs on operation mode signal of a first logic level when ;performing a current-leak test of the semiconductor integrated circuit, and that outputs an operation mode signal of a second logic level when operating the semiconductor integrated circuit in normal operation;
   disable means that inhibits the operation of the first circuit and forcibly fixes an output of the first circuit to a prescribed logic level when the operation mode signal is of the first logic level, and enable operation of the first circuit when the operation mode signal is of the second logic level;
   a third circuit that is a logic gate logically equivalent to the first circuit in normal operation, that receives a data signal identical to that supplied to the first circuit; and
   selection means, having a first data input connected to the output of the first circuit and a second data input connected to the output of the third circuit, that transmits the output of the first circuit to an internal circuit of the semiconductor integrated circuit when the operation mode signal is of the second logic level, and transmits the output of an third circuit to the internal circuit when the operation mode signal is of the first logic level.

9. The circuit according to claim 8, wherein the selection means has first and second gate means; the first gate means receiving the operation mode signal and output of the third circuit and outputting output of the third circuit when the operation mode signal is of the first logic level, and when the operation mode signal is of the second logic level, outputting a signal of logic level outputted by the first circuit when the operation mode signal is of the first logic level; and
   the second gate means receiving the output of the first circuit and the output of the first gate means and transmitting output of the first gate means when the operation-mode signal is of the first logic level, and when the operation mode signal is of the second logic level, transmitting the output of the first circuit.

10. A semiconductor integrated circuit adapted for a current-leak test, including both a first circuit of an analog circuit and a second circuit of $\pi$ digital circuit, the semiconductor integrated circuit comprising:
   operation mode signal generating means that outputs an operation mode signal of a first logic level when performing a current-leak test of the semiconductor integrated circuit, and that outputs an operation mode signal of a second logic level when operating the semiconductor integrated circuit in normal operation;
   disable means that inhibits the operation of the first circuit and forcibly fixes an output of the first circuit to a prescribed logic level when the operation mode signal is of the first logic level, and enables operation of the first circuit when the operation mode signal is of the second logic level;
   a third circuit that is a logic gate logically equivalent to the first circuit in normal operation, that receives a data signal identical to that supplied to the first circuit; and
   selection means, having a first data input connected to the output of the first circuit and a second data input connected to an output of the third circuit, that transmits the output of the first circuit to an internal circuit of the semiconductor integrated circuit when the operation mode signal is of the second logic level, and transmits the output of the third circuit to the internal circuit when the operation mode signal is of the first logic level,
   wherein the selection means has first and second gate means; the first gate means receiving the operation mode signal and output of the third circuit and outputting output of the third circuit when the operation mode signal is of the first logic level, and when the operation mode signal is of the second logic level, outputting a signal of logic level identical to the signal of the prescribed logic level outputted by the first circuit when the operation mode signal is of the first logic level; and
   the second gate means receiving the output of the first circuit and the output of the first gate means and transmitting output of the first gate means when the operation-mode signal is of the first logic level, and when the operation mode signal is of the second logic level, transmitting the output of the first circuit.

* * * * *